United States Patent
Ohmi et al.

(10) Patent No.: US 7,404,991 B2
(45) Date of Patent: Jul. 29, 2008

(54) DEVICE AND CONTROL METHOD FOR MICRO WAVE PLASMA PROCESSING

(75) Inventors: Tadahiro Ohmi, Sendai (JP); Masaki Hirayama, Sendai (JP); Shigetoshi Sugawa, Sendai (JP); Tetsuya Goto, Sendai (JP)

(73) Assignee: Tokyo Electron Limited (JP)

( * ) Notice: Subject to any disclaimer, the term of this patent is extended or adjusted under 35 U.S.C. 154(b) by 179 days.

(21) Appl. No.: 10/472,849

(22) PCT Filed: Mar. 28, 2002

(86) PCT No.: PCT/JP02/03114
§ 371 (c)(1),
(2), (4) Date: Sep. 26, 2003

(87) PCT Pub. No.: WO02/080632
PCT Pub. Date: Oct. 10, 2002

(65) Prior Publication Data
US 2004/0097089 A1    May 20, 2004

(30) Foreign Application Priority Data
Mar. 28, 2001    (JP)    ............... 2001-094278

(51) Int. Cl.
*H05H 1/24*    (2006.01)
(52) U.S. Cl. .............. 427/569; 427/575; 118/723 MW; 118/723 ME; 118/723 AN
(58) Field of Classification Search ......... 118/723 MW, 118/723 ME, 723 AN; 427/575, 569
See application file for complete search history.

(56) References Cited

U.S. PATENT DOCUMENTS

| | | | | |
|---|---|---|---|---|
| 4,678,644 A | * | 7/1987 | Fukuta et al. ........... | 422/186.05 |
| 4,866,346 A | * | 9/1989 | Gaudreau et al. ...... | 315/111.21 |
| 4,898,118 A | | 2/1990 | Murakami et al. | |
| 4,970,435 A | | 11/1990 | Tanaka et al. | |
| 5,003,152 A | * | 3/1991 | Matsuo et al. ......... | 219/121.59 |
| 5,037,666 A | * | 8/1991 | Mori ......................... | 427/575 |
| 5,038,713 A | * | 8/1991 | Kawakami et al. ... | 118/723 MA |

(Continued)

FOREIGN PATENT DOCUMENTS

EP    0 415 122 A2    3/1991

(Continued)

OTHER PUBLICATIONS

European Search Report issued by the European Patent Office on Apr. 5, 2007, for corresponding European Application No. 07000526.9-2208.

*Primary Examiner*—Bret Chen
(74) *Attorney, Agent, or Firm*—Finnegan, Henderson, Farabow, Garrett & Dunner, L.L.P.

(57) ABSTRACT

A microwave is introduced into a process chamber through a waveguide (26) of the plasma process apparatus, thereby generating plasma. A reflection monitor (40) and an electric power monitor (42) monitor the electric power of a reflected wave reflected by the plasma that is generated in the process chamber. Moreover, an incidence monitor (36) and a frequency monitor (48) monitor the frequency of the microwave generated by a magnetron (24). An electric power supplied to the magnetron (24) is controlled based on the monitored electric power of the reflected wave and the monitored frequency. This method thus controls plasma density to a constant level.

12 Claims, 4 Drawing Sheets

U.S. PATENT DOCUMENTS

| | | | |
|---|---|---|---|
| 5,290,993 A * | 3/1994 | Kaji et al. | 219/121.43 |
| 5,310,426 A * | 5/1994 | Mori | 118/723 AN |
| 5,543,689 A * | 8/1996 | Ohta et al. | 315/111.21 |
| 5,688,357 A | 11/1997 | Hanawa | |
| 5,785,807 A * | 7/1998 | Kanai et al. | 216/69 |
| 6,161,498 A * | 12/2000 | Toraguchi et al. | 118/723 MW |
| 6,286,454 B1 * | 9/2001 | Hirayama et al. | 118/723 MW |
| 6,311,638 B1 * | 11/2001 | Ishii et al. | 118/723 MA |
| 6,512,385 B1 * | 1/2003 | Pfaff et al. | 324/753 |
| 6,562,079 B1 * | 5/2003 | Takamatsu | 118/723 MR |
| 6,620,290 B2 * | 9/2003 | Yamamoto et al. | 156/345.41 |
| 6,726,802 B2 * | 4/2004 | Tadera et al. | 156/345.41 |
| 6,792,889 B2 * | 9/2004 | Nakano et al. | 118/723 E |
| 6,851,939 B2 * | 2/2005 | Lee et al. | 417/569 |

FOREIGN PATENT DOCUMENTS

| | | |
|---|---|---|
| EP | 0 481 198 A2 | 4/1992 |
| JP | 02281600 | 11/1990 |
| JP | 6-52994 | 2/1994 |
| JP | 6-196412 | 7/1994 |
| JP | 2000-49146 | 2/2000 |
| JP | 2000-299198 | 10/2000 |
| WO | WO 01/06268 A1 | 1/2001 |

* cited by examiner

BEFORE IMPROVEMENT

AFTER IMPROVEMENT (1Torr, 1.6kW, Ar/O$_2$=690/23sccm)

DEVICE AND CONTROL METHOD FOR MICRO WAVE PLASMA PROCESSING

TECHNICAL FIELD

The invention generally relates to microwave plasma process apparatuses, and particularly relates to a microwave plasma process apparatus which accomplishes plasma process by microwave-excited plasma.

BACKGROUND TECHNOLOGY

In recent years, microwave plasma process apparatus has been attracting attention in the field of plasma process apparatus. The microwave plasma process apparatus has a plasma potential that is lower than that of other plasma process apparatuses such as parallel-plate-type plasma process apparatus or an ECR plasma process apparatus. Because of this, the microwave plasma process apparatus can generate plasma having relatively low electronic temperature and relatively low ion irradiation energy.

It follows that the microwave plasma process apparatus can prevent a substrate subjected to the plasma process from sustaining metal contamination or sustaining damage caused by ion irradiation, Moreover, since a plasma excitation space can be separated from a process space, a plasma process independent of a substrate material and patterns formed on the substrate can be accomplished.

The microwave plasma process apparatus has a slot antenna (electrode) for introducing microwave generated by a magnetron into a process chamber where the microwave may be 2.45 GHz, for example. The microwave generated by the magnetron is supplied to the slot antenna (electrode) through a waveguide and a coaxial pipe, and is introduced from the slot antenna into the process chamber.

Part of the microwave, when entering the slot antenna from the coaxial pipe, is reflected at a junction point, thereby returning to the waveguide. Moreover, when plasma is created directly under the slot antenna, the microwave will be reflected by the plasma to return to the waveguide through the coaxial pipe. In consideration of this, a matching device (tuner) is provided halfway through the waveguide so as to send back the returning microwave to the slot antenna. Between the magnetron and the matching device is provided an incidence monitor for detecting the incidence microwave. Control is engaged in such as to maintain a constant level of the incident wave detected by the incident monitor. This achieves such control that the microwave of a constant level is introduced into plasma-excited gas. Since the matching device is configured to send back the returning wave by calculating the load impedance in the process chamber, high precision may not be achieved to send back all the returning wave. In consideration of this, a filter is provided upstream relative to the incidence monitor to absorb the returning wave, thereby preventing the returning wave to reach the magnetron.

Such an incident and returning wave monitor is situated between the magnetron and the matching device, i.e., situated upstream relative to the matching device when the magnetron is regarded as an originating source. The incident monitor is thus able to monitor the reflected wave that is not sent back by the matching device. However, the electric power of the microwave reflected by plasma cannot be monitored.

The amount of a microwave reflected by plasma varies with the density of the generated plasma, so that the electric power of the reflected wave serves as an index indicative of plasma density. Since the conventional microwave plasma process apparatus cannot monitor the plasma-reflected microwave, however, it is not possible to control the introduction of a microwave based on the density of generated plasma.

Moreover, the frequency of a microwave generated by the magnetron has about a ±2% variation, and the density of generated plasma varies as the frequency of a microwave changes. That is, variation in microwave frequency is a factor that changes the density of plasma. The conventional microwave plasma process apparatus, however, does not monitor the frequency of a microwave that is actually supplied to the slot antenna. No measure is taken to prevent a change in plasma density caused by fluctuation of microwave frequency. Therefore, a change in the reflected wave caused by the variation of plasma density partly includes a change caused by the fluctuation of microwave frequency.

DISCLOSURE OF INVENTION

The invention is made in view of the above-stated points, and is aimed at providing a microwave plasma process apparatus and a plasma process controlling method which monitor a reflected microwave to control plasma density to a constant level.

The invention is characterized in that the following measures are taken in order to achieve the object described above.

A microwave plasma process apparatus according to the invention performs a plasma process by plasma that is generated by a microwave, characterized by comprising a microwave generator which generates a microwave, a process chamber which contains an object for treatment by plasma process, a waveguide which guides the microwave generated by said microwave generator to said process chamber, and a reflected-wave monitoring unit which monitors an electric power of a reflected wave that is reflected by plasma occurring in said process chamber.

Another microwave plasma process apparatus according to the invention performs a plasma process by plasma that is generated by a microwave, characterized by comprising a microwave generator which generates a microwave, a process chamber which contains an object for treatment by plasma process, a waveguide which guides the microwave generated by said microwave generator to said process chamber; and a frequency monitoring unit which detects a frequency of the microwave generated by said microwave generator.

Another microwave plasma process apparatus according to the invention performs a plasma process by plasma that is generated by a microwave, characterized by comprising a microwave generator which generates a microwave, a process chamber which contains an object for treatment by plasma process, a waveguide which guides the microwave generated by said microwave generator to said process chamber, a reflected-wave monitoring unit which monitors an electric power of a reflected wave that is reflected by plasma occurring in said process chamber, and a frequency monitoring unit which detects a frequency of the microwave generated by said microwave generator.

A plasma process controlling method according to the invention treats an object by use of plasma that is generated by a microwave, characterized by comprising guiding a microwave generated by a microwave generator to a process chamber through a waveguide so as to generate plasma inside said process chamber, and monitoring an electric power of a reflected microwave that is reflected by the plasma occurring in said process chamber.

Another plasma process controlling method according to the invention treats an object by use of plasma that is generated by a microwave, characterized by comprising guiding a microwave generated by a microwave generator to a process chamber through a waveguide so as to generate plasma inside said process chamber, and monitoring a frequency of the microwave generated by said microwave generator.

Another plasma process controlling method according to the invention treats an object by use of plasma that is generated by a microwave, characterized by comprising guiding a microwave generated by a microwave generator to a process chamber through a waveguide so as to generate plasma inside said process chamber, monitoring a frequency of the microwave generated by said microwave generator, and monitoring an electric power of a reflected microwave that is reflected by the plasma occurring in said process chamber.

According to the invention described above, the electric power of a microwave reflected by the generated plasma is detected. The reflectance of plasma reflecting a microwave depends on plasma density. It follows that the monitoring of the electric power of a reflected wave provides for the monitoring of plasma density, thereby making it possible to control a plasma process for the purpose of achieving optimal plasma density. In particular, the electric power of a microwave supplied to the plasma generator is controlled based on the electric power of the reflected wave, thereby maintaining constant plasma density.

Moreover, the monitoring of frequency of a microwave generated by the microwave generator makes it possible to monitor a change in the plasma density caused by frequency fluctuation. In particular, the electric power supplied to the plasma generator is controlled based on the monitored frequency, thereby maintaining constant plasma density even under the presence of frequency fluctuation.

Furthermore, the electric power supplied to the plasma generator is controlled based on the electric power of a reflected wave and the frequency of a microwave, thereby achieving further accuracy in maintaining constant plasma density.

BRIEF DESCRIPTION OF THE DRAWINGS

FIG. 3 is an expanded cross-sectional view of the connection of a coaxial pipe and a slot antenna in the microwave plasma process apparatus shown in FIG. 1, wherein

BEST MODE FOR CARRYING OUT THE INVENTION

Figure 1:
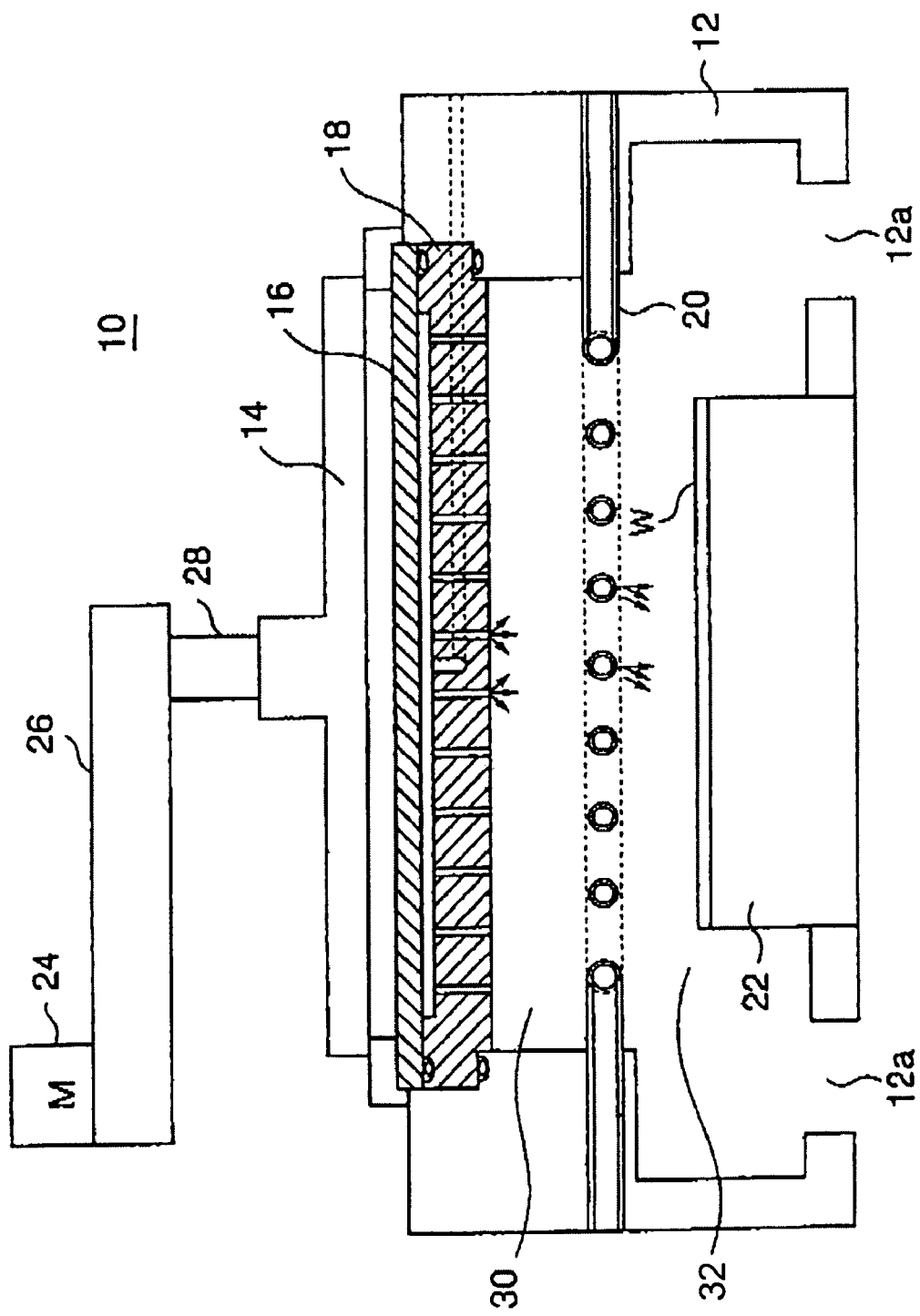
FIG. 1 is a drawing showing a schematic construction of a microwave plasma process apparatus according to an embodiment of the invention.

In the following, embodiments of the invention will be described with reference to the accompanying drawings. FIG. 1 is a drawing showing a schematic construction of a microwave plasma process apparatus according to an embodiment of the invention.

A microwave plasma process apparatus 10 shown in FIG. 1 includes a process chamber 12, a slot antenna 14 provided above the process chamber 12, a dielectric partition 16 provided under the slot antenna 14, a plasma-excitation-gas shower plate 18 provided under the dielectric partition 16, a process-gas shower plate 20 situated below the plasma-excitation-gas shower plate 18, a mount stand 22 situated under the process-gas shower plate 20, and a magnetron (microwave generator) 24 for generating microwave.

Microwave of 2.45 GHz, for example, generated by the magnetron 24 is guided to the slot antenna 14 through a waveguide 26 and a coaxial pipe 28. The microwave guided to the slot antenna 14 passes through the dielectric partition 16 and the plasma-excitation-gas shower plate 18 to be introduced into the plasma excitation space 30.

Plasma excitation gas such as argon (Ar) and kripton (Kr) is supplied from the plasma-excitation-gas shower plate 18 to the plasma excitation space 30. The plasma excitation gas is then excited by microwave, thereby generating plasma. The plasma generated in the plasma excitation space 30 passes through the openings of the process-gas shower plate 20 having a lattice shape, for example, to enter the process space 32.

A prearranged process gas is supplied from the process-gas shower plate 20 to the process space 32. A semiconductor wafer W is placed on the mount stand 22 arranged in the process space 32 as an object to be processed, and is subjected to the plasma process accomplished by the process gas and plasma. Exhaust gas produced by the plasma process is removed by a vacuum pump (not shown) through exhaust outlets 12a provided at the bottom of the process chamber 12.

Figure 2:
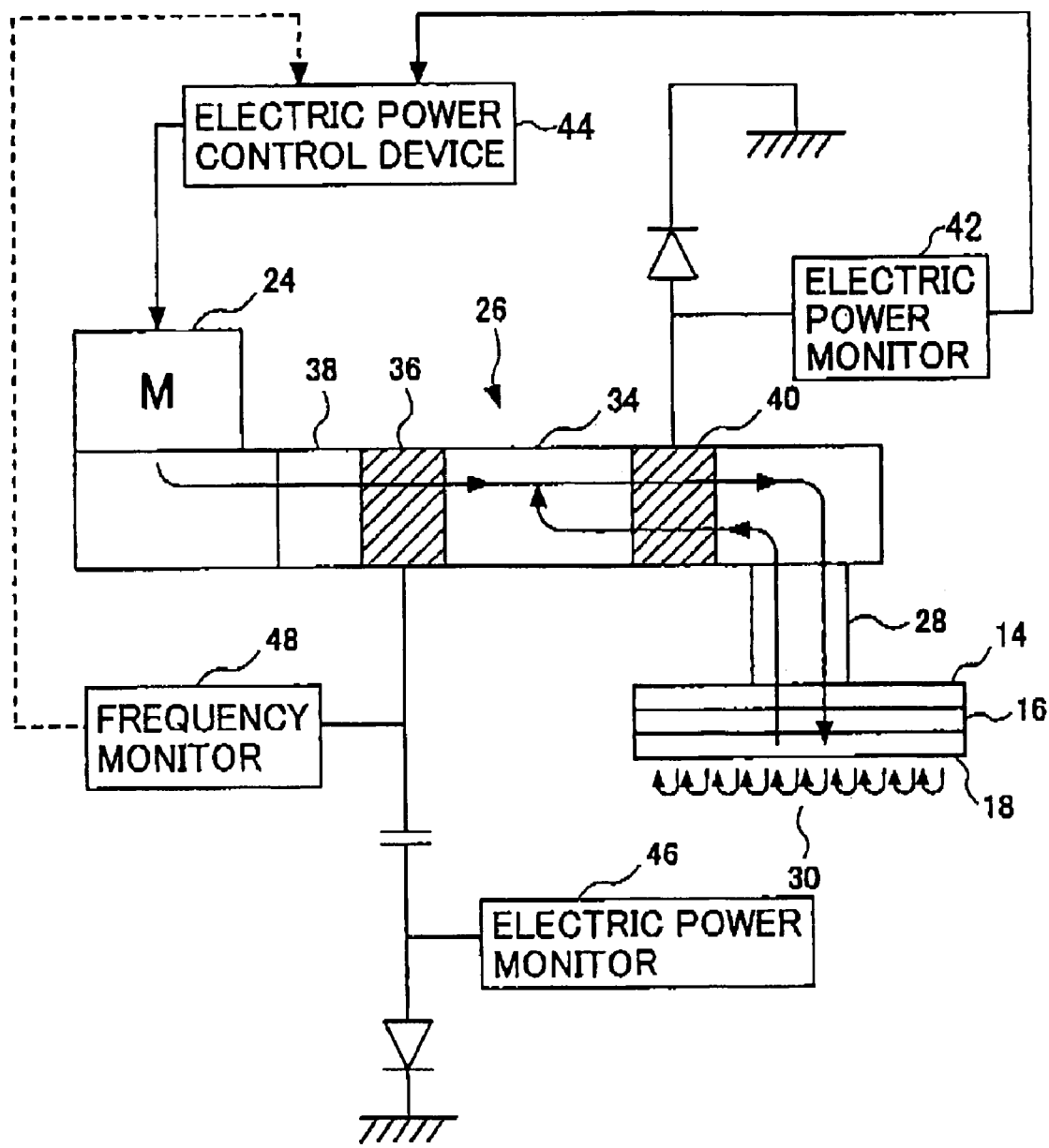
FIG. 2 is a drawing showing the construction of a path along which a microwave reaches a plasma excitation space from a magnetron.

In the following, a description will be given of a method of controlling the plasma process generated in the microwave plasma process apparatus 10, with reference to FIG. 2. FIG. 2 is a drawing showing the construction of a path along which a microwave reaches the plasma excitation space 30 from the magnetron 24.

Microwave of 2.45 GHz, for example, generated by the magnetron 24 is supplied to the slot antenna 14 through the waveguide 26 and the coaxial pipe 28. The microwave supplied to the slot antenna 14 is evenly distributed, and is introduced into the plasma excitation space 30 through the dielectric partition 16 and the plasma-excitation-gas shower plate 18.

Plasma excitation gas such as argon (Ar) and kripton (Kr) is supplied to the plasma excitation space 30 from the plasma-excitation-gas shower plate 18. As microwave is introduced to the plasma excitation gas, plasma ignition occurs, thereby accomplishing plasma inside the whole plasma excitation space 30. Since the generated plasma acts as an electric conductor, 20% to 30% of the microwave will be reflected near the surface of the plasma-excitation-gas shower plate 18. The reflected microwave will return to the waveguide 26 through the plasma-excitation-gas shower plate 18, the dielectric partition 16, and the slot antenna 14. The amount (magnitude) of the microwave reflected by the plasma depends on the density of plasma. The denser the plasma density in the plasma excitation space 30, the larger the coefficient of reflection is, and the less denser the plasma density, the smaller the coefficient of reflection is.

In the middle of the waveguide 26, the matching device 34 is provided in order to send back the reflected wave to the slot antenna 14. Moreover, the incidence monitor 36 is provided near the matching device 34 on its side closer to the magnetron 24, and monitors an electric power of the microwave supplied to the slot antenna 14, i.e., monitors the electric power of the incident wave. The arrangement of the matching device 34 and the incidence monitor 36 is the same as that of a conventional microwave plasma process apparatus. Further, a filter 38 is provided to absorb the reflected wave that is not sent back by the matching device 34, thereby preventing it from returning to the magnetron 24.

Although the construction described above can monitor the incident wave by the incidence monitor 36, the microwave reflected by the generated plasma cannot be monitored The matching device 36 is provided between the incidence monitor 36 and the slot antenna 14, and the matching device 34 sends back most of the reflected wave to the slot antenna 14. Therefore, the incidence monitor 36 can detect only part of the reflected wave that is not sent back by the matching device 34.

In this embodiment, a reflection monitor 40 is provided halfway through the waveguide 26 so as to monitor an electric power of the returning wave, which is reflected by the plasma generated in the plasma excitation space 30. The reflection monitor 40 is situated near the matching device 34 on its side closer to the slot antenna. Accordingly, the reflection monitor 40 monitors the reflected wave before it is sent back by the matching device 34, thereby covering all the wave reflected by the generated plasma.

Figure 3A:
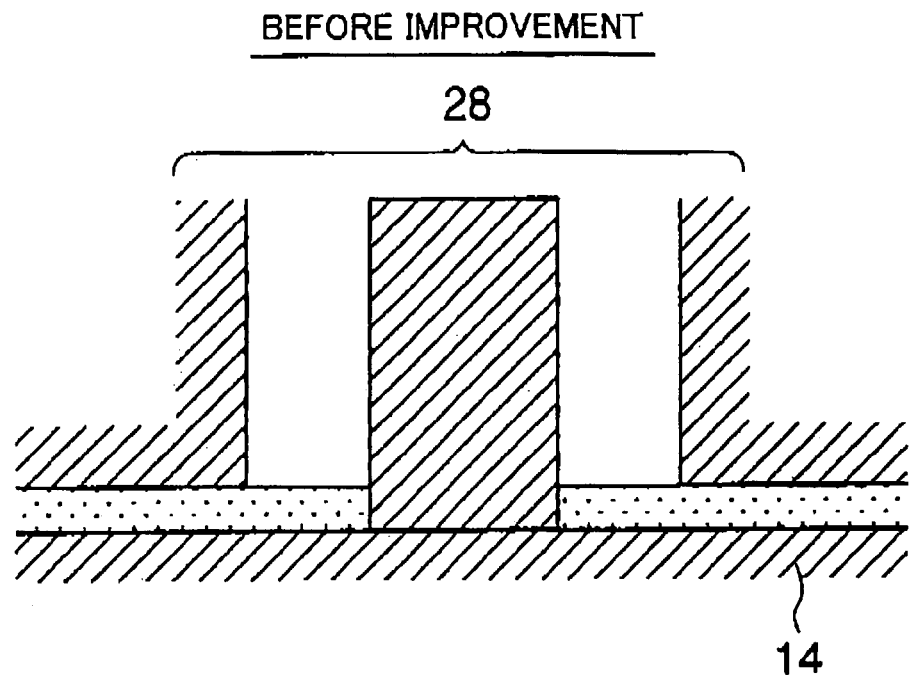
FIG. 3A shows the structure of the connection before improvement.
Figure 3A:
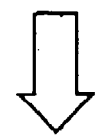
Figure 3B:
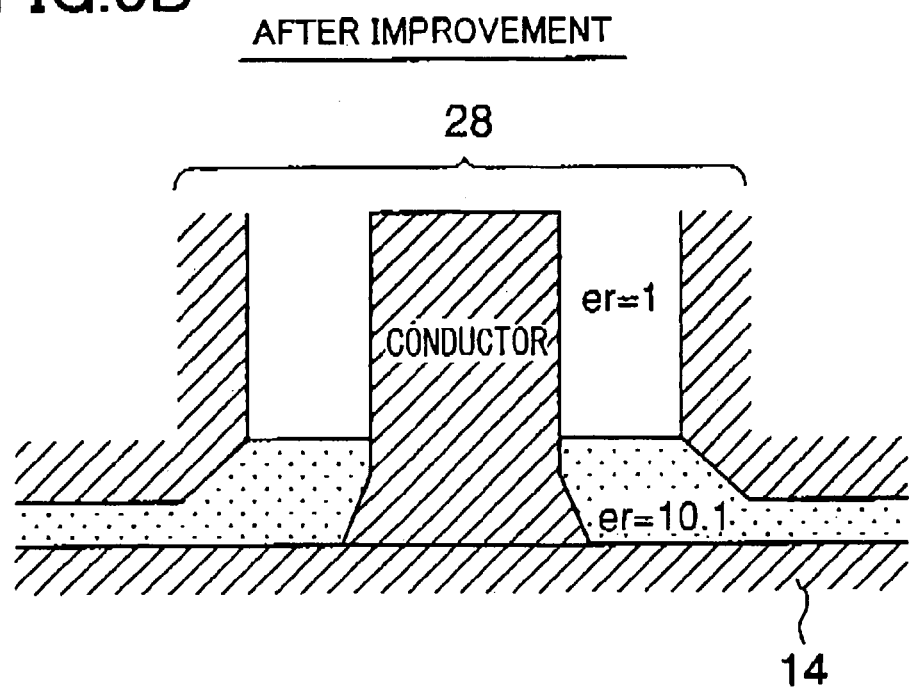
FIG. 3B shows the structure of the connection after the improvement.

FIG. 3 is an expanded cross-sectional view of the connection of the coaxial pipe 28 and the slot antenna 14 in the microwave plasma process apparatus 10. FIG. 3A shows the structure of the connection before improvement, and FIG. 3B shows the structure of the connection after the improvement. In the microwave plasma process apparatus according to this embodiment, the connecting portion of the coaxial pipe 28 is tapered as shown in FIG. 3B for the purpose of suppressing the reflection of a microwave along the propagation path. With this provision, the coefficient of reflection of the microwave is stably suppressed to a low value.

Figure 4:
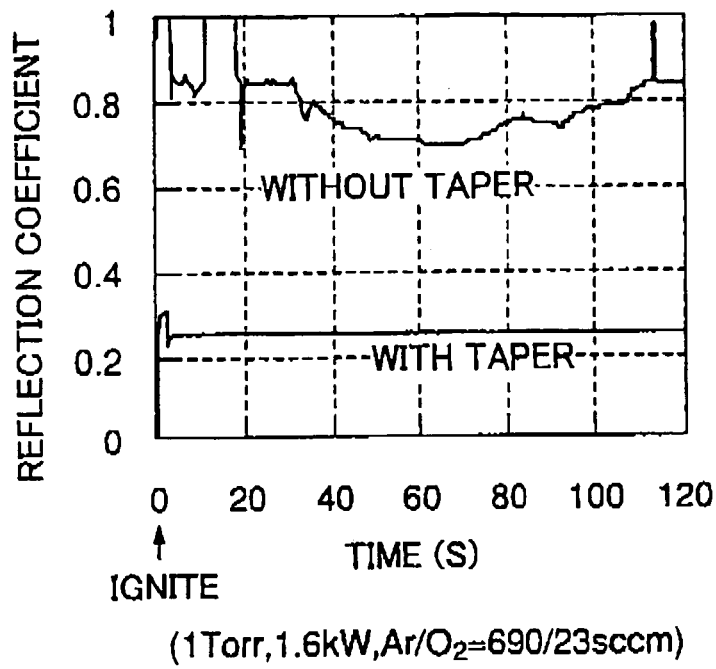
FIG. 4 is a chart showing the coefficient of reflection a microwave is supplied through the coaxial pipe having the connection before the improvement as well as the coefficient of reflection when a microwave is supplied through the coaxial pipe having the connection after the improvement.

FIG. 4 is a chart showing the coefficient of reflection when a microwave is supplied through the coaxial pipe 28 having the connection before the improvement as well as the coefficient of reflection when a microwave is supplied through the coaxial pipe 28 having the connection after the improvement (i.e., a connection having a tapered shape). In the case of no improvement, the coefficient of reflection is as high as about 0.8 and shows poor stability, whereas in the case of improvement, the coefficient of reflection stays low at approximately 0.25 and stable, except for the early stage of microwave introduction.

With the improved connection, the reflection of a microwave along the propagation path is suppressed to a possible minimum, so that it is the generated plasma that causes most of the reflection When the improved connection is employed to supply microwave to the slot antenna 14, the monitoring of the electric power of the reflected microwave can detect changes in the plasma density with high accuracy.

The output of the reflection monitor 40 is detected by an electric power monitor 42, and the detected electric power is supplied to an electric power control device 44. The electric power control device 44 is configured to control the electric power of a microwave supplied from the magnetron 24 in response to the electric power detected by the reflection monitor 40. In other words, the electric power control device 44 controls an electric power supplied from the magnetron 24 such that the electric power detected by the reflection monitor 40 is maintained at a predetermined constant value.

Here, the electric power monitor 42 detects the electric power of the reflected wave that passes the reflection monitor 40, such reflected wave being substantially equal to one that is returning to the waveguide 26 upon reflection by the generated plasma.

Wave reflection is also caused by other factors in addition to plasma. Such reflected wave, however, is not dependent on the state (density) of plasma, but stays constant. Accordingly, when the electric power of the reflected wave that is monitored by the reflection monitor 40 changes, such a change can be attributable to a change in the plasma density.

In this embodiment, the electric power of the reflected wave detected by the electric power monitor 42 is supplied to the electric power control device 44, which controls an electric power to the magnetron 24 based on the density of generated plasma, thereby adjusting the electric power of the microwave generated by the magnetron 24, resulting in the control that maintains plasma density constant in the plasma excitation space 30. In this embodiment, a reflection monitoring means is comprised of the reflection monitor 40 and the electric power monitor 42, and the electric power control means 44 controls an electric power to the magnetron 24 based on the output of the reflection monitoring means.

Accordingly, the microwave plasma process apparatus 10 according to this embodiment can maintain a constant plasma density generated by microwave, and can prevent fluctuation of the plasma process caused by a change in the plasma density, thereby achieving a uniform and high quality plasma process. If the reflected wave that is monitored by the reflection exhibits a large fluctuation, it can be ascertained that the microwave plasma process apparatus 10 is suffering a malfunction, thereby issuing a warning to an operator. The operation of the apparatus may be automatically brought to a halt.

The incidence monitor 36 described above is provided mainly for the purpose of monitoring the electric power of the microwave (incident wave) supplied to the slot antenna. That is, the electric power of the incident wave is monitored by having the incidence monitor 36 and the electric power monitor 46 detect the electric power of the microwave that propagates towards the slot antenna 14. The output of the incidence monitor 36 thus indicates the microwave supplied from the magnetron 24.

In addition to the monitoring of the electric power of a reflected wave as described above, this embodiment utilizes the output of the incidence monitor 36, and uses a frequency monitor 48 to detect the frequency of a microwave generated by the magnetron 24. When a microwave path including the slot antenna is designed to suppress the reflection of waves, such a design ends up depending on the frequency of the microwave that propagates through the path.

Figure 5:
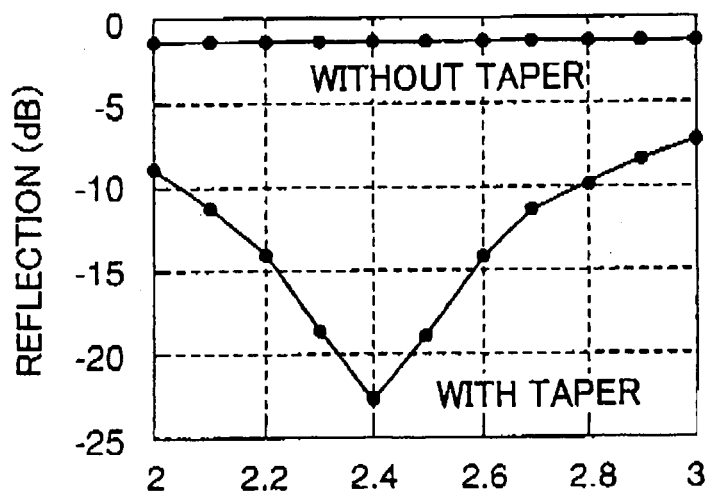
FIG. 5 is a chart showing calculated reflection characteristics in the case of the improved connecting portion of the coaxial pipe.

FIG. 5 is a chart showing calculated reflection characteristics in the case of the improved connecting portion of the coaxial pipe 28 as shown in FIG. 3B. The post-improvement reflection characteristics shown in FIG. 5 correspond to a case in which design is made such as to minimize reflection at 2.4 GHz. As shown in FIG. 5, the coefficient of post-improvement reflection assumes its minimum at the designed frequency, and rises sharply before and after the designed frequency (2.4 GHz).

In general, the frequency of a microwave generated by a magnetron is not so accurate, and has a fluctuation of approximately ±2%. If the frequency of a microwave has fluctuation, the reflectance of a microwave path changes significantly, resulting in a change in the electric power of the microwave supplied to the slot antenna 14. Thereby, a change will also arise in plasma density. In order to estimate plasma density according to the electric power of a reflected wave, thus, it is necessary to accurately monitor the frequency of a microwave, so as to compensate for the change in the electric power of the reflected wave resulting from frequency fluctuation.

In this embodiment, the frequency monitor 48 detects the frequency of a microwave. If the detected frequency falls outside a predetermined range, a warning may be issued to the operator, or the apparatus may be brought to a halt. Alternatively, the frequency of the microwave generated by the magnetron 24 may be controlled to be constant based on the detected frequency.

Alternatively, as shown by the dotted lines in FIG. 2, the frequency detected by the frequency monitor 48 may be supplied to the electric power control device 44, thereby controlling an electric power to the magnetron 24 based on the detected frequency.

Namely, since the reflectance changes in response to the fluctuation of frequency, a change in the reflectance resulting from frequency fluctuation is determined beforehand through computation or actual measurement, and the electric power of a microwave is controlled in such a manner as to compensate for a change in the reflectance, thereby keeping constant the plasma density in the plasma excitation space 30. This makes it possible to compensate through the control of an electric power of a microwave as long as the frequency fluctuation falls within a certain range, thereby eliminating a need for the magnetron 24 to provide a highly accurate frequency.

Moreover, if a frequency change falls outside the predetermined range, a warning is issued or the operation of the apparatus is brought to a halt. If the frequency change falls within the predetermined range, the electric power of the microwave supplied by the magnetron 24 is controlled to adjust the density of generated plasma to a constant level. Namely, if the frequency of a microwave supplied by the magnetron 24 falls within a small range, the adjustment of an electric power of the microwave can maintain the density of generated plasma at a constant level. In such a case, control is applied to the electric power of a microwave generated by the magnetron. On the other hand, if the frequency of a microwave supplied by the magnetron 24 shows a large fluctuation, it is ascertained that the magnetron suffers a malfunction, or a mere adjustment of the electric power of microwave supply is not sufficient to maintain a constant plasma density. The operation of the apparatus is then brought to a halt.

In this manner, this embodiment provides the frequency monitoring means comprised of the incidence monitor 36 and the electric power monitor 48, and the electric power control means 44 controls the electric power of a microwave supplied from the magnetron 24 based on the output of the frequency monitoring means.

Moreover, provision may be made such that the electric power control means 44 controls an electric power supplied by the magnetron 24 based on both the output of the reflection monitoring means and the output of the frequency monitoring means. In this case, the control of plasma density is made more accurate.

INDUSTRIAL APPLICABILITY

According to the invention, the electric power of a microwave reflected by generated plasma is detected as described above. The reflectance of plasma reflecting a microwave depends on plasma density. It follows that the monitoring of the electric power of a reflected wave provides for the monitoring of plasma density, thereby making it possible to control a plasma process for the purpose of achieving optimal plasma density. In particular, the electric power of a microwave supplied by the plasma generator is controlled based on the electric power of the reflected wave, thereby maintaining constant plasma density.

Moreover, the monitoring of frequency of a microwave generated by the microwave generator makes it possible to monitor a change in the plasma density caused by frequency fluctuation. In particular, the electric power supplied by the plasma generator is controlled based on the monitored frequency, thereby maintaining constant plasma density even under the presence of frequency fluctuation.

Furthermore, the electric power supplied by the plasma generator is controlled based on the electric power of a reflected wave and the frequency of a microwave, thereby achieving further accuracy in maintaining constant plasma density.

The invention claimed is:

1. A plasma process controlling method for treating an object by use of plasma that is generated by a microwave, comprising:
    guiding a microwave generated by a microwave generator to a process chamber through a waveguide so as to generate plasma inside said process chamber;
    monitoring a frequency of the microwave generated by said microwave generator;
    monitoring an electric power of a reflected microwave that is reflected by the plasma generated in said process chamber; and
    controlling an electric power supplied to said microwave generator based on the electric power of the reflected microwave to provide a constant plasma density in the process chamber.

2. A plasma process controlling method for treating an object by use of plasma that is generated by a microwave comprising:
    guiding a microwave generated by a microwave generator to a process chamber through a waveguide so as to generate plasma inside said process chamber;
    monitoring an electric power of a reflected microwave;
    monitoring a frequency of the microwave generated by said microwave generator; and
    controlling an electric power supplied to said microwave generator based on the frequency of the microwave to provide a constant plasma density in the process chamber.

3. The plasma process controlling method as claimed in claim 2, further comprising:
    controlling the electric power of the microwave supplied to said microwave generator based on the frequency of the microwave if a frequency fluctuation of the microwave falls within a predetermined range, and stopping treatment of the object if the frequency fluctuation of the microwave falls outside the predetermined range.

4. A plasma process controlling method for treating an object by use of plasma that is generated by a microwave, comprising:
    guiding a microwave generated by a microwave generator to a process chamber through a waveguide so as to generate plasma inside said process chamber;
    monitoring a frequency of the microwave generated by said microwave generator;
    monitoring an electric power of a reflected microwave that is reflected by the plasma occurring in said process chamber; and
    controlling an electric power supplied to said microwave generator based on the electric power of the reflected wave and the frequency of the microwave to provide a constant plasma density in the process chamber.

5. The plasma process controlling method as claimed in claim 4, further comprising:

controlling the electric power of the microwave supplied to said microwave generator based on the electric power of the reflected wave and the frequency of the microwave if a frequency fluctuation of the microwave falls within a predetermined range, and stopping treatment of the object if the frequency fluctuation of the microwave falls outside the predetermined range.

6. A microwave plasma process apparatus for performing a plasma process by plasma that is generated by a microwave, comprising:

a microwave generator;
an electric power controlling device supplying electric power to said microwave generator to generate a microwave having a frequency;
a process chamber for accommodating an object for treatment by plasma process;
a waveguide which guides the microwave generated by said microwave generator to said process chamber; and
a reflected-wave monitoring unit which monitors an electric power of a reflected wave, said reflected-wave monitoring unit including:
 a reflection monitor which is provided in said waveguide, and
 an electric power monitor which detects the electric power of the reflected wave monitored by said reflection monitor,
wherein said reflected-wave monitoring unit is adapted to monitor a change in density of the plasma generated in said process chamber through a change in the electric power of the reflected waves, and
wherein the electric power controlling device is configured to control the electric power supplied to said microwave generator based on the frequency to provide a constant plasma density.

7. The microwave plasma process apparatus as claimed in claim 6, wherein the electric power controlled by the-electric power controlling device is supplied to said microwave generator based on the electric power of the reflected wave output from said reflected-wave monitoring unit.

8. A microwave plasma process apparatus for performing a plasma process by plasma that is generated by a microwave, comprising:

a microwave generator;
an electric power controlling device supplying electric power to said microwave generator to generate a microwave having a frequency;
a process chamber for accommodating an object for treatment by plasma process;
a waveguide which guides the microwave generated by said microwave generator to said process chamber; and
a reflected-wave monitoring unit which monitors an electric power of a reflected wave that is reflected by plasma generated in said process chamber, said reflected-wave monitoring unit including:
 a reflection monitor which is provided in said waveguide, and
 an electric power monitor which detects the electric power of the reflected wave monitored by said reflection monitor,
wherein said waveguide has a matching device for sending back the reflected wave to said process chamber,
wherein said reflection monitor is provided in said waveguide between said matching device and said process chamber, and
wherein the electric power controlling device is configured to control the electric power supplied to said microwave generator based on the frequency to provide a constant plasma density in the process chamber.

9. A microwave plasma process apparatus for performing a plasma process by plasma that is generated by a microwave, comprising:

a microwave generator;
an electric power controlling device supplying electric power to said microwave generator to generate a microwave having an unstable frequency;
a process chamber for accommodating an object for treatment by plasma process;
a waveguide which guides the microwave generated by said microwave generator to said process chamber; and
a frequency monitoring unit which detects a frequency of the microwave generated by said microwave generator, said frequency monitoring unit including:
 an incident monitor which monitors an electric power of the microwave supplied from said microwave generator, and
 a frequency monitor which detects a frequency of the output from said incident monitor,
wherein the electric power controlling device is configured to control the electric power supplied to said microwave generator based on the unstable frequency to provide a constant plasma density in the process chamber.

10. The microwave plasma process apparatus as claimed in claim 9, wherein said waveguide has a matching device for sending back a reflected wave to said process chamber, and said incident monitor is provided in said waveguide between said matching device and said microwave generator.

11. The microwave plasma process apparatus as claimed in claim 9, wherein the electric power controlling device controls the electric power supplied to said microwave generator based on the frequency detected by said frequency monitoring unit.

12. A microwave plasma process apparatus for performing a plasma process by plasma that is generated by a microwave, comprising:

a microwave generator;
an electric power controlling device supplying electric power to said microwave generator to generate a microwave having a frequency;
a process chamber for accommodating an object for treatment by plasma process;
a waveguide which guides the microwave generated by said microwave generator to said process chamber;
a reflected-wave monitoring unit which monitors an electric power of a reflected wave that is reflected by plasma occurring in said process chamber; and
a frequency monitoring unit which detects a frequency of the microwave generated by said microwave generator,
wherein the electric power controlling device is configured to control the electric power supplied to said microwave generator based on the electric power of the reflected wave output from said reflected-wave monitoring unit and the frequency detected by said frequency monitoring unit.

* * * * *

UNITED STATES PATENT AND TRADEMARK OFFICE
CERTIFICATE OF CORRECTION

PATENT NO. : 7,404,991 B2
APPLICATION NO. : 10/472849
DATED : July 29, 2008
INVENTOR(S) : Tadahiro Ohmi et al.

It is certified that error appears in the above-identified patent and that said Letters Patent is hereby corrected as shown below:

On the title page, block number (54), "MICRO WAVE" should read --MICROWAVE--.

In claim 6, column 9, line 32, "waves," should read --wave,--.

In claim 7, column 9, line 38, "the-electric" should read --the electric--.

Signed and Sealed this

Twenty-second Day of September, 2009

David J. Kappos
*Director of the United States Patent and Trademark Office*

UNITED STATES PATENT AND TRADEMARK OFFICE
CERTIFICATE OF CORRECTION

PATENT NO. : 7,404,991 B2
APPLICATION NO. : 10/472849
DATED : July 29, 2008
INVENTOR(S) : Tadahiro Ohmi et al.

It is certified that error appears in the above-identified patent and that said Letters Patent is hereby corrected as shown below:

On the title page, Item (54) and Column 1, lines 1 and 2, "MICRO WAVE" should read --MICROWAVE--.

In claim 6, column 9, line 32, "waves," should read --wave,--.

In claim 7, column 9, line 38, "the-electric" should read --the electric--.

This certificate supersedes the Certificate of Correction issued September 22, 2009.

Signed and Sealed this

Twenty-seventh Day of October, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,404,991 B2 | |
| APPLICATION NO. | : 10/472849 | |
| DATED | : July 29, 2008 | |
| INVENTOR(S) | : Tadahiro Ohmi et al. | |

It is certified that error appears in the above-identified patent and that said Letters Patent is hereby corrected as shown below:

Title Page
Please insert at block number (73) the name of the Assignee.

--Tadahiro Ohmi--

Signed and Sealed this
Twelfth Day of July, 2011

David J. Kappos
*Director of the United States Patent and Trademark Office*